United States Patent
Jung

(10) Patent No.: US 7,879,664 B2
(45) Date of Patent: Feb. 1, 2011

(54) LIQUID CRYSTAL DISPLAY DEVICE HAVING DRIVE CIRCUIT

(75) Inventor: Yun-Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/690,738

(22) Filed: Jan. 20, 2010

(65) Prior Publication Data

US 2010/0117089 A1    May 13, 2010

Related U.S. Application Data

(62) Division of application No. 11/984,031, filed on Nov. 13, 2007, now Pat. No. 7,674,664, which is a division of application No. 10/745,614, filed on Dec. 29, 2003, now Pat. No. 7,312,471.

(30) Foreign Application Priority Data

Dec. 30, 2002  (KR) ............................... 2002-87302

(51) Int. Cl.
*H01L 21/8234* (2006.01)
(52) U.S. Cl. ................. 438/166; 257/72; 257/E21.413
(58) Field of Classification Search ................ 438/166; 257/72, E21.413
See application file for complete search history.

(56) References Cited

U.S. PATENT DOCUMENTS

| 5,696,003 | A  | 12/1997 | Makita et al.   |
|-----------|----|---------|-----------------|
| 5,696,388 | A  | 12/1997 | Funada et al.   |
| 5,966,193 | A  | 10/1999 | Zhang et al.    |
| 6,207,971 | B1 | 3/2001  | Jinno et al.    |
| 6,452,213 | B1 | 9/2002  | Kimura et al.   |
| 6,452,241 | B1 | 9/2002  | Fukata et al.   |
| 6,479,837 | B1 | 11/2002 | Ogawa et al.    |
| 6,737,672 | B2 | 5/2004  | Hara et al.     |
| 6,906,346 | B2 | 6/2005  | Nishitani et al.|
| 2001/0005020 | A1 | 6/2001 | Jinno et al.   |
| 2002/0000554 | A1 | 1/2002 | Yamazaki et al.|
| 2002/0031876 | A1 | 3/2002 | Hara et al.    |

(Continued)

FOREIGN PATENT DOCUMENTS

KR    1999-0066433    8/1999

(Continued)

*Primary Examiner*—Steven J Fulk
(74) *Attorney, Agent, or Firm*—Birch, Stewart, Kolasch & Birch, LLP

(57) ABSTRACT

A fabricating method of an array substrate for a liquid crystal display device including forming a polycrystalline silicon film on a substrate having a display region and a peripheral region, the polycrystalline silicon film having grains of square shape, forming a first active layer in the display region and a second active layer in the peripheral region by etching the polycrystalline silicon film, forming a first gate electrode over the first active layer, a second gate electrode over the second active layer and a gate line connected to the first gate electrode, and forming first source and drain electrodes connected to the first active layer, second source and drain electrodes connected to the second active layer and data line connected to the first source electrode. Further, the second gate electrode overlaps the first active layer to form a first channel region, and the first channel region is formed inside one of the grains.

4 Claims, 15 Drawing Sheets

U.S. PATENT DOCUMENTS

| | | |
|---|---|---|
| 2003/0040146 A1 | 2/2003 | Kang et al. |
| 2004/0009632 A1 | 1/2004 | Tanabe et al. |
| 2004/0053450 A1 | 3/2004 | Sposili et al. |
| 2006/0060130 A1* | 3/2006 | Im .............................. 117/46 |

FOREIGN PATENT DOCUMENTS

| | | |
|---|---|---|
| KR | 2001-0066251 | 7/2001 |
| KR | 2002-0091352 | 12/2002 |

* cited by examiner

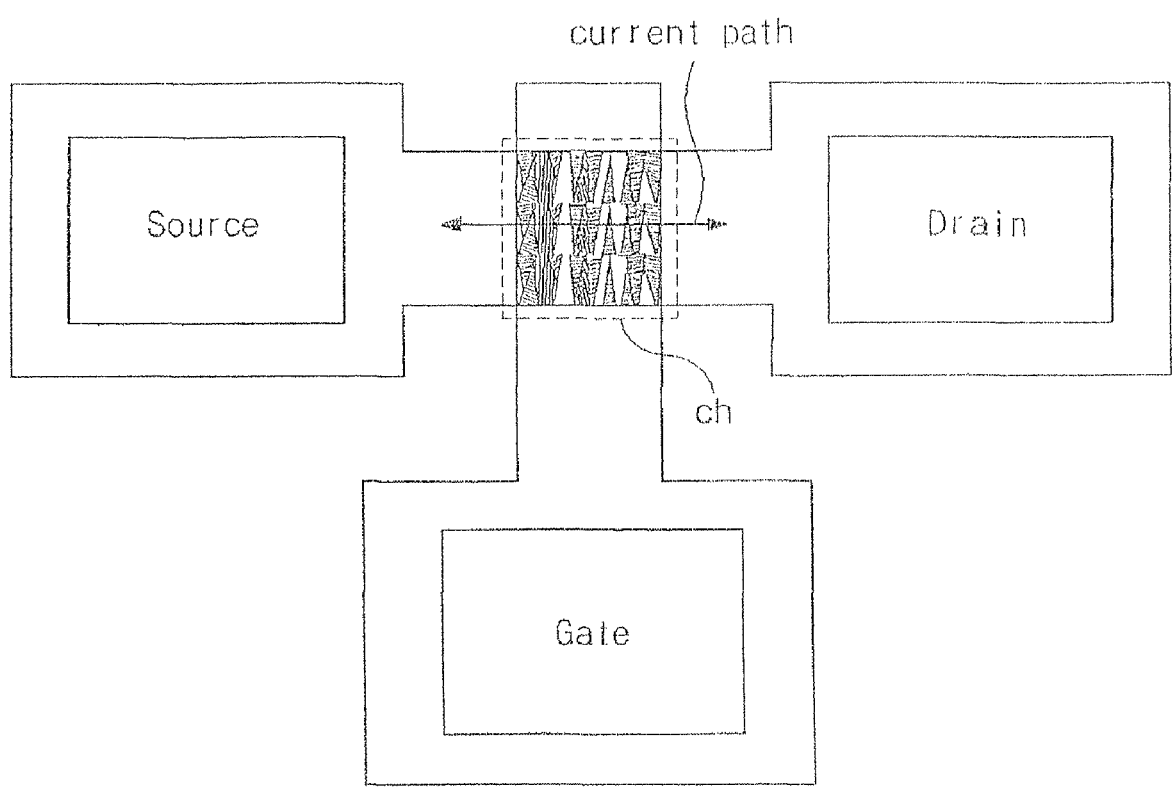

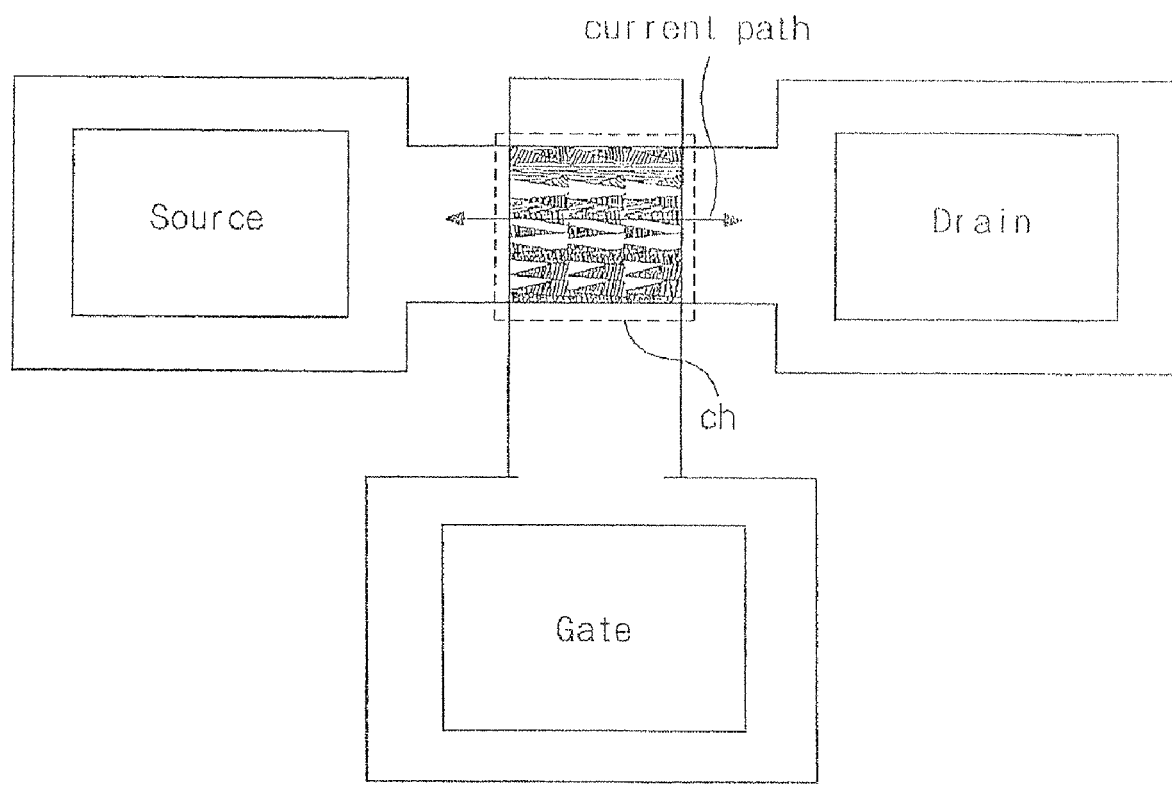

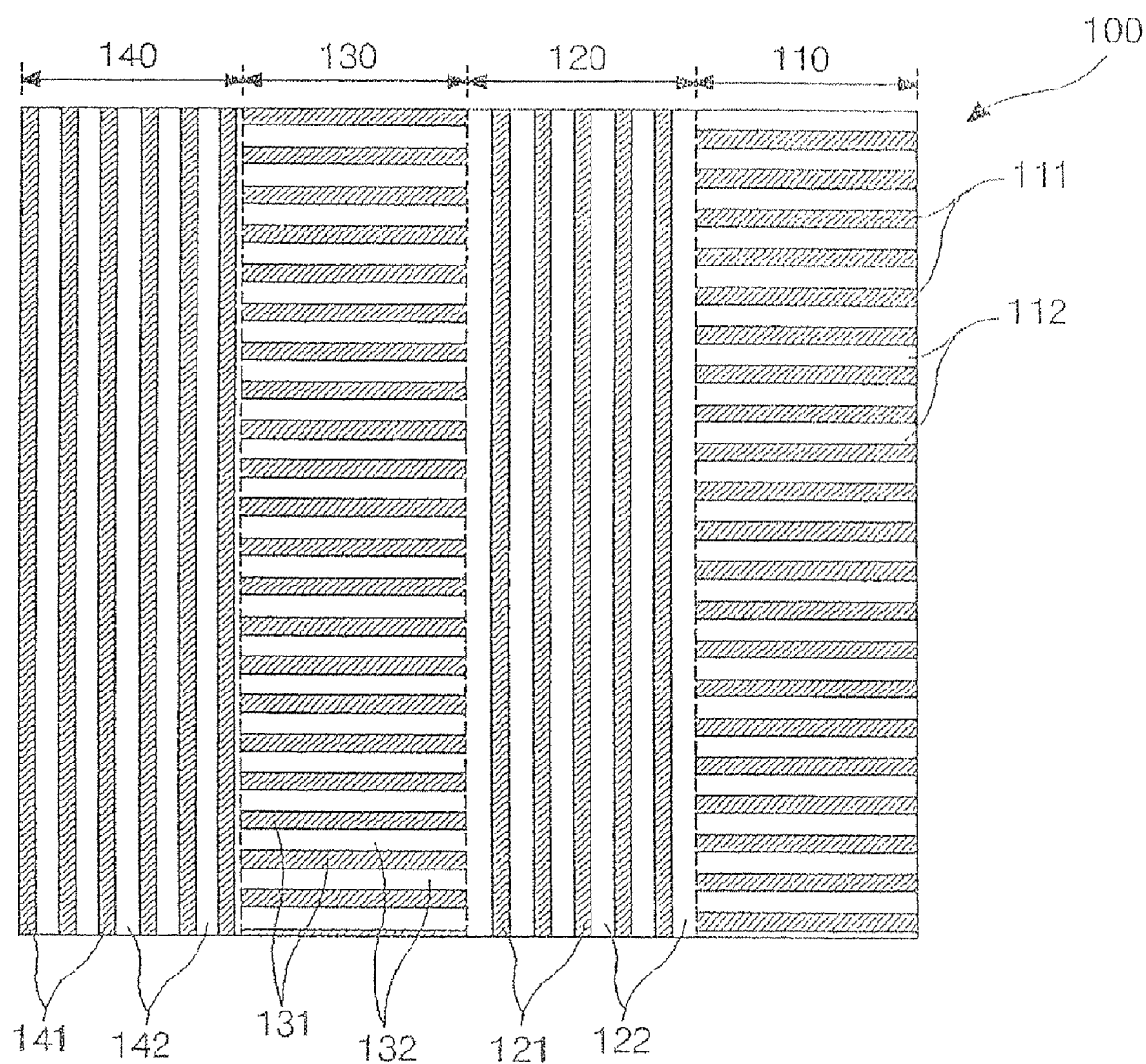

LIQUID CRYSTAL DISPLAY DEVICE HAVING DRIVE CIRCUIT

CROSS REFERENCE TO RELATED APPLICATIONS

This Application is a divisional of U.S. application Ser. No. 11/984,031 filed Nov. 13, 2007 now U.S. Pat. No. 7,674,664, which is a divisional of U.S. application Ser. No. 10/745,614 filed Dec. 29, 2003 now U.S. Pat. No. 7,312,471, which claims the benefit of the Korean Application No. P2002-87302 filed on Dec. 30, 2002, the entire contents of which is hereby incorporated by reference.

BACKGROUND OF THE INVENTION

1. Field of the Invention

The invention relates to a liquid crystal display device, and more particularly, to a liquid crystal display device that includes a driving circuit composed of polycrystalline silicon thin film transistors.

2. Discussion of the Related Art

Liquid crystal display (LCD) devices are developing as the next generation of display devices because they are portable and consume little power. In general, an LCD device includes two substrates disposed such that respective electrodes of the two substrates face into each other. A liquid crystal layer is interposed between the respective electrodes. When a voltage is applied to the electrodes, an electric field is generated. The electric field modulates the light transmittance of the liquid crystal layer by reorienting the liquid crystal molecules, thereby displaying images in the LCD device.

One substrate of an LCD device includes a thin film transistor (TFT) that acts as a switching device. The TFT is often formed using amorphous silicon as an active layer. One reason for this is that amorphous silicon can be formed on a large, low cost substrate such as glass. LCD devices also include drive integrated circuits (drive ICs) that control the TFT. Unfortunately, amorphous silicon does not form a suitable active layer for drive ICs, which are usually CMOS (complementary metal-oxide-semiconductor) devices that require an active layer of single crystalline silicon. Because of this, drive ICs are usually connected to a TFT substrate using a TAB (tape automated bonding) system. This adds significant cost to LCD devices.

Because of the limitations of amorphous silicon, LCD devices that incorporate a polycrystalline silicon TFT, in which polycrystalline silicon is used as an active layer, are under research and development. Polycrystalline silicon is highly preferred because it is better suited for use in a drive IC than amorphous silicon. Polycrystalline silicon thus has the advantage that the number of fabrication steps can be reduced because thin film transistors and drive ICs can be formed on the same substrate, thus eliminating the need for TAB bonding. Furthermore, the field effect mobility of polycrystalline silicon is 100 to 200 times greater than that of amorphous silicon. Polycrystalline silicon is also optically and thermally stable.

Among many recent methods of forming polycrystalline silicon, a new method of crystallization, often referred to as sequential lateral solidification (SLS), has become of interest. The SLS method takes advantage of the fact that silicon grains grow laterally from the phase boundary between liquid silicon and solid silicon. The SLS method can increase the size of the silicon grains by controlling the energy intensity of a laser beam and the irradiation range of the laser beam used to grow the silicon grains.

FIG. 1 shows a schematic view of an apparatus for the related art SLS method.

FIG. 1 depicts an apparatus for the SLS method that includes a light source 1, an attenuator 3, a focusing lens 9, a mask 11, an imaging lens 13, and a moving stage 19 on which a sample 17 having an amorphous silicon layer 20 (of FIG. 2A) is situated. The apparatus for the SLS method also includes first to third reflective mirrors 5, 7, and 15 to change the direction of the light. The first and second reflective mirrors 5 and 7 are disposed between the attenuator 3 and the focusing lens 9, and the third reflective mirror 17 is disposed between the imaging lens 13 and the moving stage 19.

The light source 1 is preferably a XeCl (xenon-chloride) excimer laser having a wavelength of 308 nm. The attenuator 3 controls the energy of the laser beam through the system. The focusing lens 9 and the imaging lens 13 condense the laser beam, while the focusing lens 9 makes the intensity of the laser beam more uniform by equalizing focus lengths of the laser beam. The mask 11 forms the laser beam into a predetermined shape.

The laser beam from the light source 1 therefore transmits through the attenuator 3 and is reflected by the first and second reflective mirrors 5 and 7. The laser beam is then condensed by the focusing lens 9, shaped by the mask 11, and passes through the imaging lens 13. The laser beam is next reflected by the third reflective mirror 15 onto the sample 17. The moving stage 19 then moves the sample 17, and irradiation is repeated.

FIGS. 2A to 2O show schematic plane views depicting a process for crystallizing an amorphous silicon film using the related art apparatus for the SLS.

In FIG. 2A, a first laser beam irradiation has been carried out at a first region "A" of an amorphous silicon film 20. As discussed above, the silicon grains grow laterally from the boundary between liquid phase silicon and solid phase silicon to result in first grains 22 growing from both sides of the first region "A." Grain growth stops at a first line "IIa" where the first grains 22 meet.

FIG. 2B shows the results of when a second laser beam irradiation is carried out at a second region "B" of the amorphous silicon film 20. The second region "B" includes part of the first region "A." In a first overlapping region "AB," where the first region "A" and the second region "B" overlap, the grains 22 (of FIG. 2A) act as crystallization seeds. Grain growth stops at a second line "IIb" where second grains 23 meet. The second grains 23 are larger than the first grains 22, which were formed after the first laser beam irradiation.

FIG. 2C shows a third laser beam irradiation accomplished at a third region "C" of the amorphous silicon film 20. Third grains 24 grow from boundaries of the third region "C". The third region "C" includes part of the second region "B." In the second overlapping region "BC," where the second region "B" and the third "C" region overlap, the second grains 23 (of FIG. 2B) act as crystallization seeds. The third grains 24 are therefore much larger than the second grains 23 (of FIG. 2B).

Repeated laser beam irradiation scans the whole amorphous silicon film 20 to create polycrystalline silicon with large grains. Furthermore, high crystallization productivity results from the small number of times the same point is irradiated.

However, a polycrystalline silicon film formed by the SLS method tends to have different-sized grains and irregular growing directions. Thus, TFTs fabricated from the polycrystalline silicon film by the SLS method also have properties that depend on the grain-growth direction and grain boundary.

FIG. 3 shows a schematic graph showing a property of a thin film transistor using a polycrystalline silicon film grown by the related SLS method.

In FIG. 3, the x-axis indicates the TFT gate voltage (Vg) and the y-axis indicates the TFT drain current (Id). Each line also shows a first case (solid lines) in which the directions of the channel-passed current and the grain-growth are parallel, a second case (short dotted lines) in which the directions of the channel passed current and the grain-growth direction form an angle of 45 degrees, and a third case (long dotted lines) in which the directions of the channel passed current and the grain-growth have an angle of 90 degrees. These lines are established at drain voltages "Vd" of 0.1 V and 10 V. FIG. 3 shows that reducing the angle between the channel direction and the grain-growth direction decreases the number of the grain boundaries. This improves the current-voltage characteristics. Therefore, if the channel direction of a TFT runs parallel with the grain-growth direction, then the TFT properties are enhanced. However, if the channel direction of a TFT and the grain-growth direction are at an angle of 90 degrees, then the properties of TFT are minimized.

FIGS. 4 and 5 show schematic plane views depicting thin film transistors formed using a polycrystalline silicon film made by the SLS method according to first and second related art embodiments, respectively. FIGS. 4 and 5 have TFTs with a grain size of the polycrystalline silicon film smaller than a channel area "ch" of the TFT.

The current path of the channel area "ch" and the grain-growth direction make an angle of 90 degrees In FIG. 4, while the current path is parallel to the grain-growth direction in FIG. 5. Since the TFT of FIG. 5 is less influenced by the grain boundary than that of FIG. 4, the TFT of FIG. 5 has superior characteristics to that of FIG. 4. A TFT using a polycrystalline silicon film by the SLS method accordingly has optimal characteristics when the current path through the channel coincides with the grain-growth direction, and the TFT has the most inferior characteristics when the current path through a channel is perpendicular to the grain-growth direction. Thus, when a polycrystalline silicon film made by the related art SLS method is used for a TFT, a uniform property of the TFT can not be obtained. Moreover, even when the best TFT is obtained, the characteristics of the TFT are not sufficient for a drive IC, but merely for a gate driver and a data driver.

SUMMARY OF THE INVENTION

Accordingly, the invention is directed to a liquid crystal display device and a fabricating method thereof that substantially obviates one or more of problems due to limitations and disadvantages of the related art.

An object of the invention is to provide a liquid crystal display device that includes a drive circuit using a polycrystalline silicon film, and a fabricating method thereof.

An object of the invention is to provide a fabricating method of a liquid crystal display device in which a thin film transistor is formed such that one grain includes at least one channel area.

The invention, in part, pertains to an array substrate for a liquid crystal display device that includes a substrate having a display region and a peripheral region; a gate line on the substrate; a data line crossing the gate line; a switching thin film transistor connected to the gate line and the data line; a gate driver connected to the gate line; a data driver connected to the data line; and a drive circuit connected to the gate driver and the data driver, wherein the gate line, the data line and the switching thin film transistor are formed in the display region, and the gate driver, the data driver and the drive circuit are formed in the peripheral region. The drive circuit includes a drive thin film transistor, and each of the switching thin film transistor and the drive thin film transistor includes an active layer, a gate electrode, and source and drain electrodes, wherein the active layer includes polycrystalline silicon having square shaped grains. Also, the gate electrode overlaps the active layer to form a channel region, wherein the channel region of the drive thin film transistor is formed inside one of the grains.

The invention, in part, pertains to a fabricating method of an array substrate for a liquid crystal display device that includes forming a polycrystalline silicon film on a substrate having a display region and a peripheral region, the polycrystalline silicon film having square shaped grains; forming a first active layer in the display region and a second active layer in the peripheral region by etching the polycrystalline silicon film; forming first gate electrode over the first active layer, a second gate electrode over the second active layer and a gate line connected to the first gate electrode; and forming first source and drain electrodes connected to the first active layer, second source and drain electrodes connected to the second active layer and data line connected to the first source electrode, wherein the second gate electrode overlaps the first active layer to form a first channel region, and the first channel region is formed inside one of the grains.

The invention, in part, pertains to a thin film transistor for a liquid crystal display device that includes a substrate; an active layer on the substrate, the active layer includes polycrystalline silicon having square shaped grains; gate electrode overlapping the active layer to form a channel region, the channel region being formed inside one of the grains; and source and drain electrodes connected to both sides of the active layer.

The invention, in part, pertains to a fabricating method of a thin film transistor for a liquid crystal display device that includes forming a polycrystalline silicon film on a substrate, the polycrystalline silicon film having square shaped grains; forming an active layer by etching the polycrystalline silicon film; forming a gate electrode over the active layer, the gate electrode overlapping the active layer to form a channel region, the channel region being formed inside one of the grains; and forming source and drain electrodes connected to both sides of the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

FIG. 4 shows a schematic plane view depicting a thin film transistor using a polycrystalline silicon film made by the SLS method according to a first embodiment of the related art.

FIG. 5 shows a schematic plane view depicting a thin film transistor using a polycrystalline silicon film made by the SLS method according to a second embodiment of the related art.

FIG. 6 shows a schematic configuration depicting a mask for a sequential lateral solidification (SLS) method according to an embodiment of the invention.

DETAILED DESCRIPTION

Figure 1:
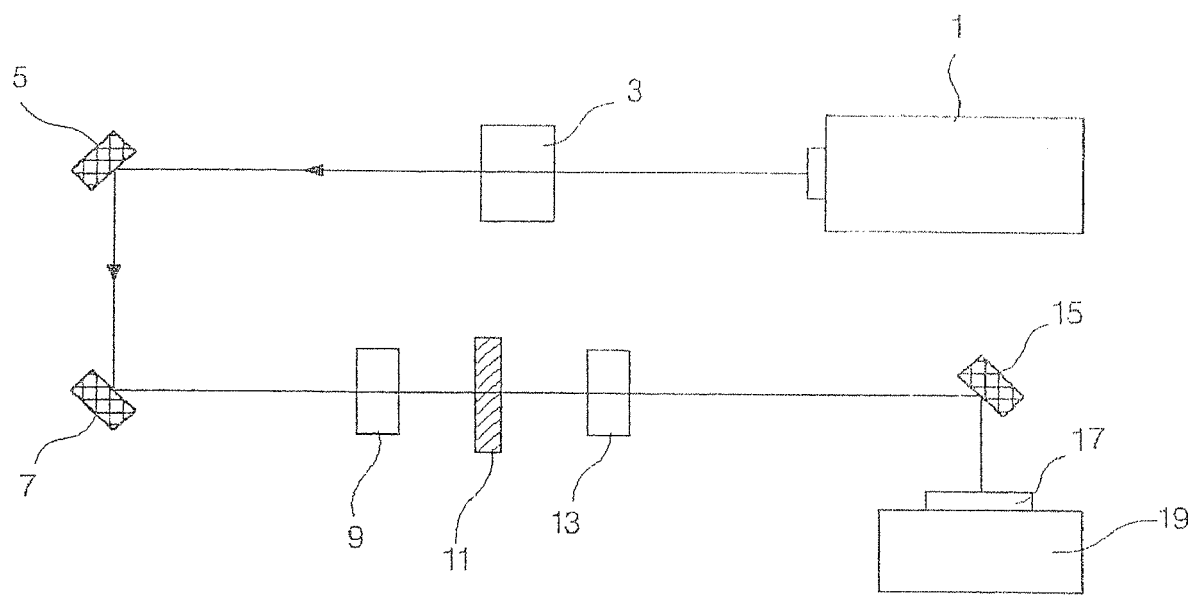
FIG. 1 shows a schematic view showing an apparatus for the related art SLS method.
Figure 2A:
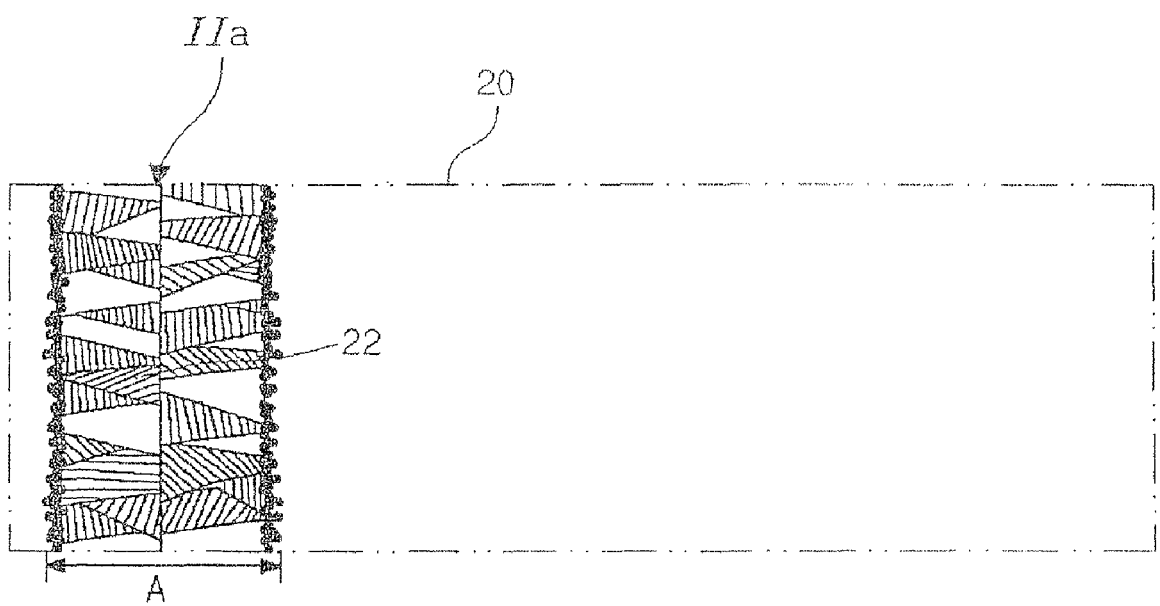
FIGS. 2A to 2C show schematic plane views showing a related art process of crystallizing an amorphous silicon film using the related art apparatus for the SLS method.
Figure 2B:
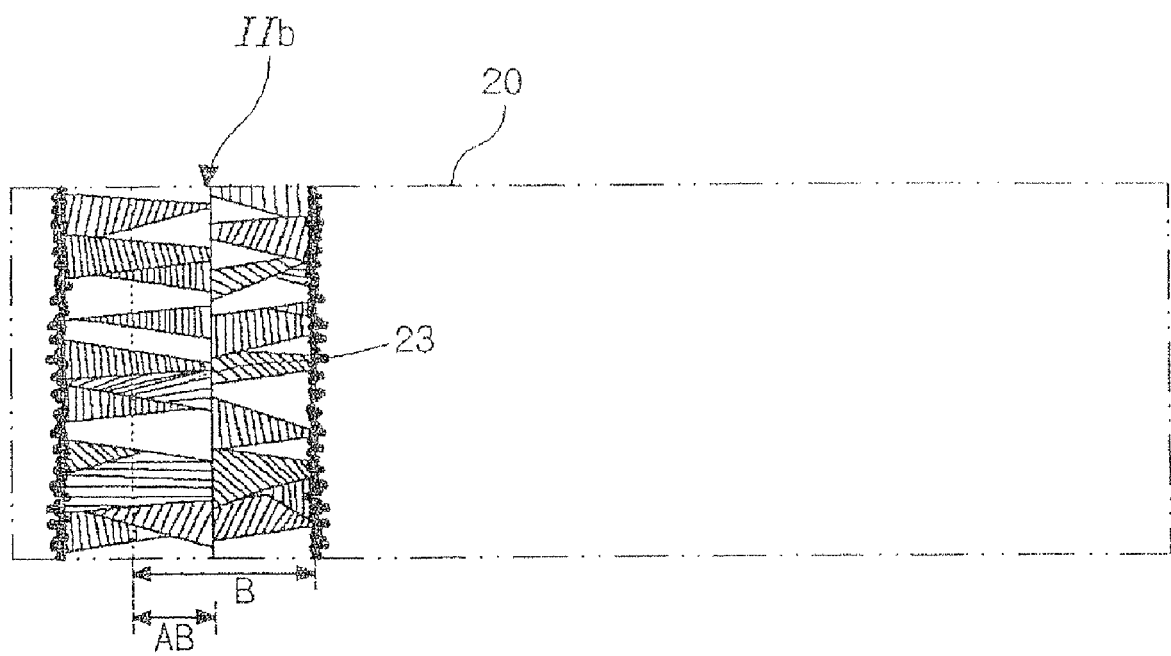
Figure 2C:
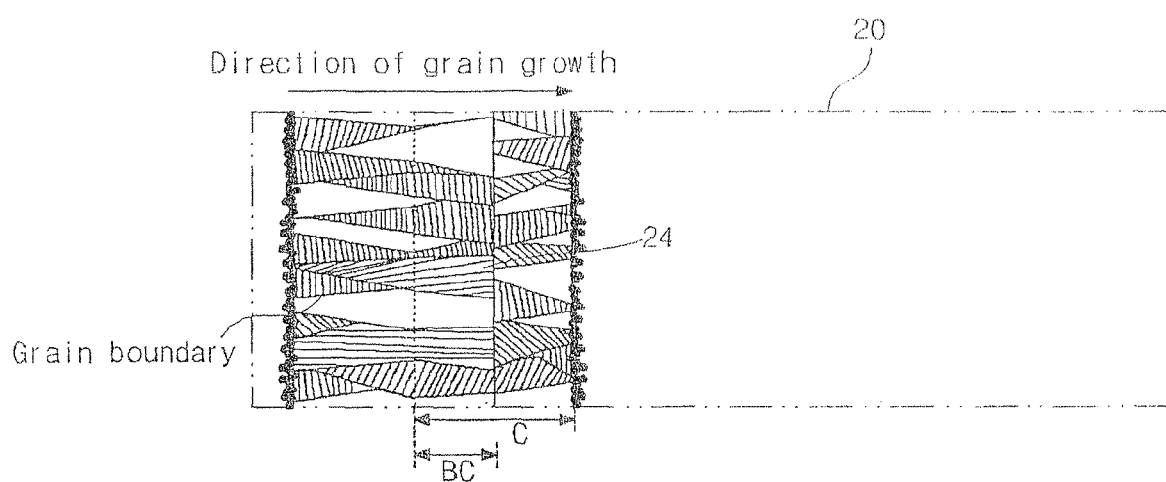
Figure 3:
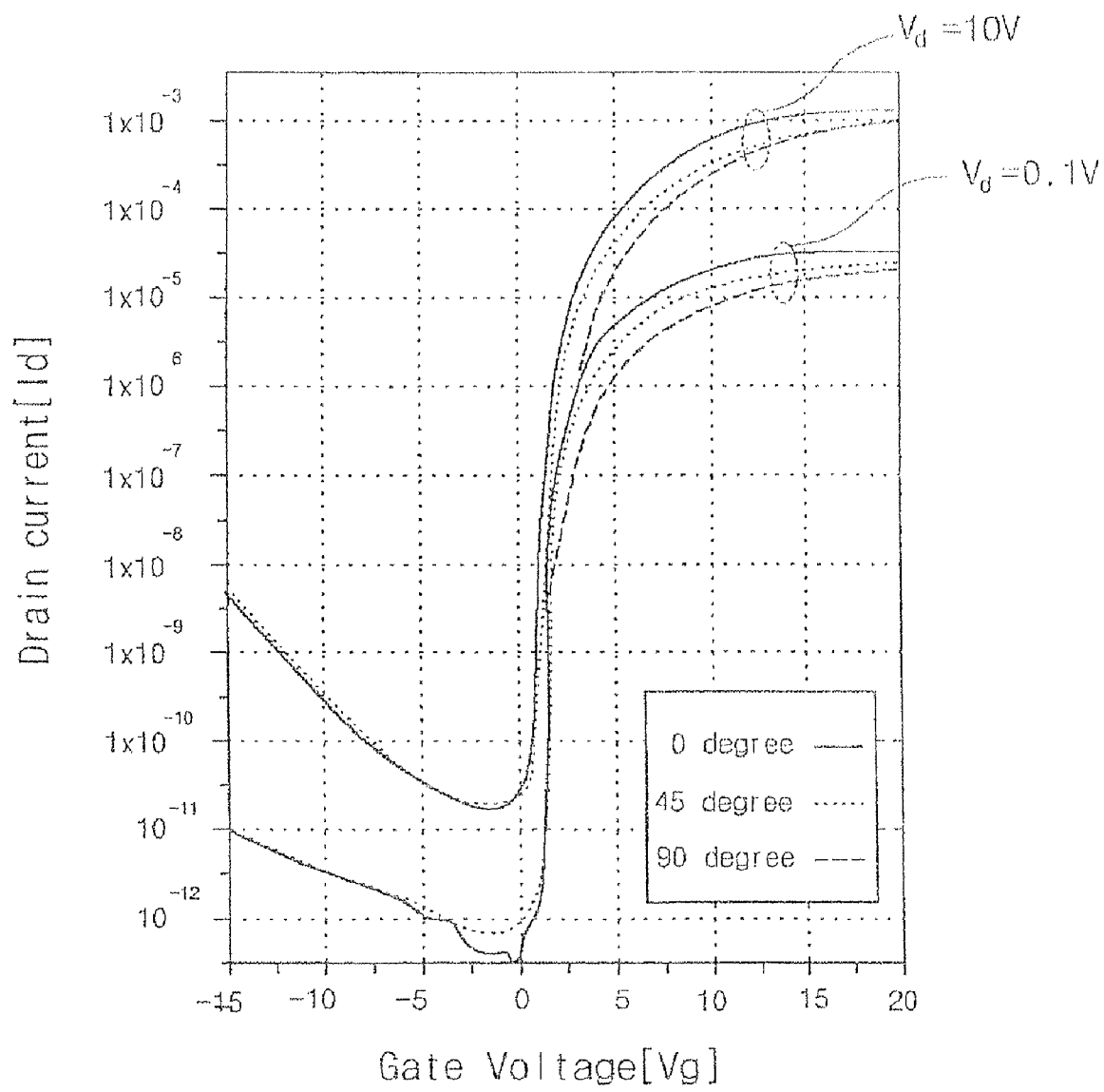
FIG. 3 shows a schematic graph showing a property of a thin film transistor using the related art polycrystalline silicon film formed by the related art SLS method.

Features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

Reference will now be made in detail to the illustrated embodiments of the invention, examples of which are illustrated in the accompanying drawings. Wherever possible, the same reference numbers are used throughout the drawings to refer to the same or like parts.

FIG. 6 shows a schematic configuration of a mask for a sequential lateral solidification (SLS) method according to an embodiment of the invention.

In FIG. 6, the mask 100 includes first to fourth regions 110, 120, 130, and 140. The first region 110 has multiple first stripes 111 separated by multiple first slits 112. The second region 120 has multiple second stripes 121 separated by multiple second slits 122. The third region 130 has multiple third stripes 131 separated by multiple third slits 132, with the third strips 131 being aligned with the first slits 112. The fourth region 140 has multiple fourth stripes 141 separated by multiple fourth slits 142, with the fourth stripes 141 corresponding to the second slits 122 of the second region 120. Here, the first stripes 111 and the third stripes 131 are parallel to a first direction, and the second stripes 121 and the fourth stripes 141 are parallel to a second direction perpendicular to the first direction. The stripes do not need to be exactly parallel, but only need to have sufficient parallel alignment to accomplish the desired result.

The multiple first to fourth stripes 111, 121, 131 and 141 of the first to fourth regions 110, 120, 130 and 140 are made of a material sufficiently opaque to shield a laser beam. The multiple first to fourth slits 112, 122, 132 and 142 are sufficiently transparent so as to transmit a laser beam. It is desirable that the widths of the multiple first to fourth stripes 111, 121, 131 and 141 be smaller than or equal to those of the multiple first to fourth slits 112, 122, 132 and 142. This allows an amorphous silicon film to be completely exposed to the laser beam using the subsequently described inventive process. The widths of the multiple first to fourth stripes 111, 121, 131 and 141 can be changed according to the energy density of the laser beam or according to the condition of the silicon film. For example, the widths of the stripes or slits can be within a range of about 2 mm to about 10 mm. Sub-ranges can be defined at 4 mm, 6 mm and 8 mm widths.

The mask 100 of FIG. 6 shows a particular arranging order of the first to fourth regions 110, 120, 130 and 140, but that order can be varied. For example, the mask 100 could be arranged in order of (from right to left) the first region 110, the third region 130, the second region 120, and the fourth region 140. The widths of the first to fourth regions 110, 120, 130 and 140 are preferably equal.

FIGS. 7A to 7D show schematic plane views of a process for crystallizing an amorphous silicon film according to an embodiment of the invention.

Figure 7A:
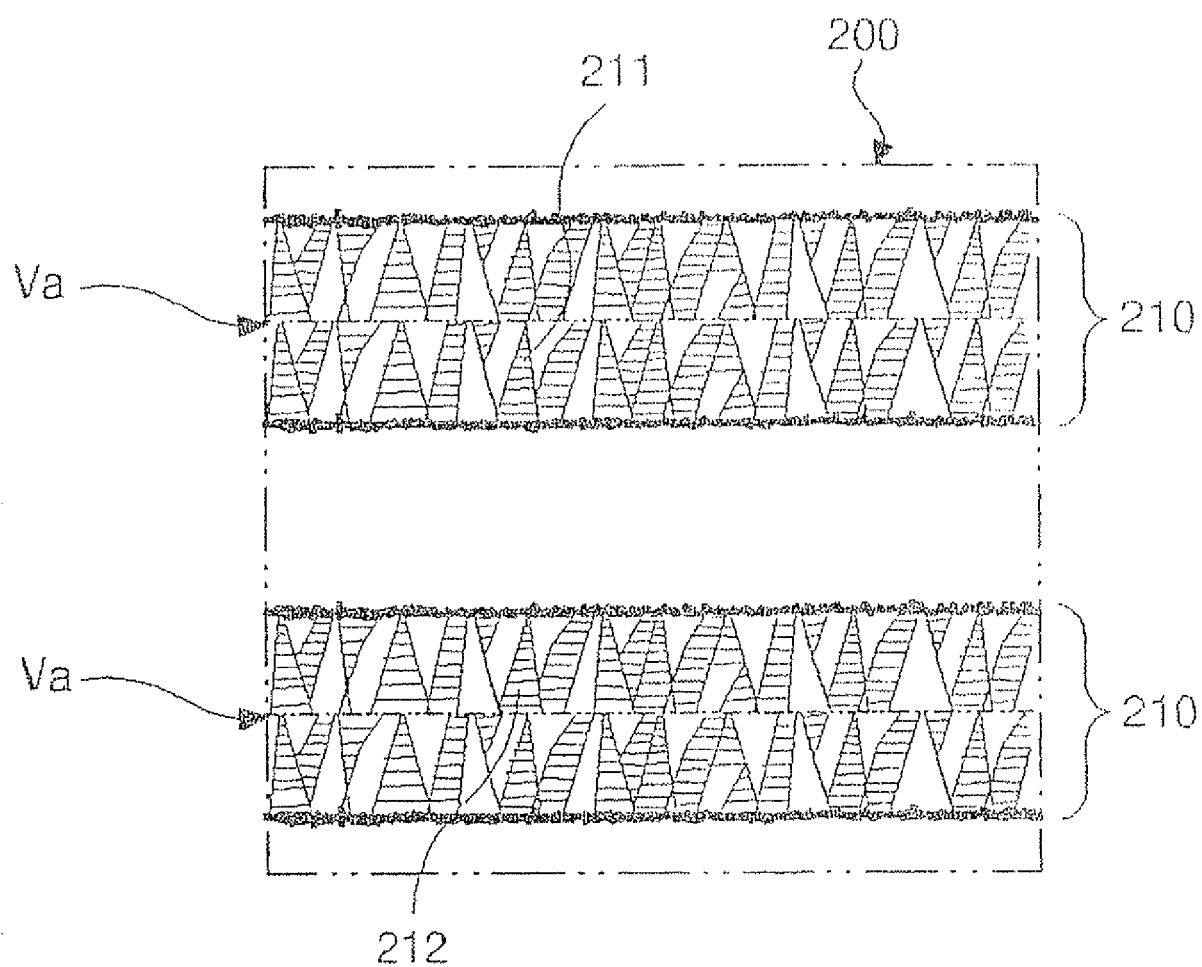
FIGS. 7A to 7D show schematic plane views depicting a process of crystallizing an amorphous silicon film according to an embodiment of the invention.

In FIG. 7A, a silicon film 200 crystallizes by a first irradiation of a laser beam through the mask 100 (of FIG. 6). The laser beam irradiates onto first portions 210 of the silicon film 200 that correspond to the multiple first slits 112 (of FIG. 6) in the first region 110 (of FIG. 6) of the mask 100. The first portions 210 melt and then cool to form first grains 211 and 212. The growth of the first grains 211 and 212 starts from the edges of the first portions 210 that are exposed to the laser beam, and the growth progresses toward the center of the first portions 210 to stop at a line "Va" where grains having different growing directions meet.

Figure 7B:
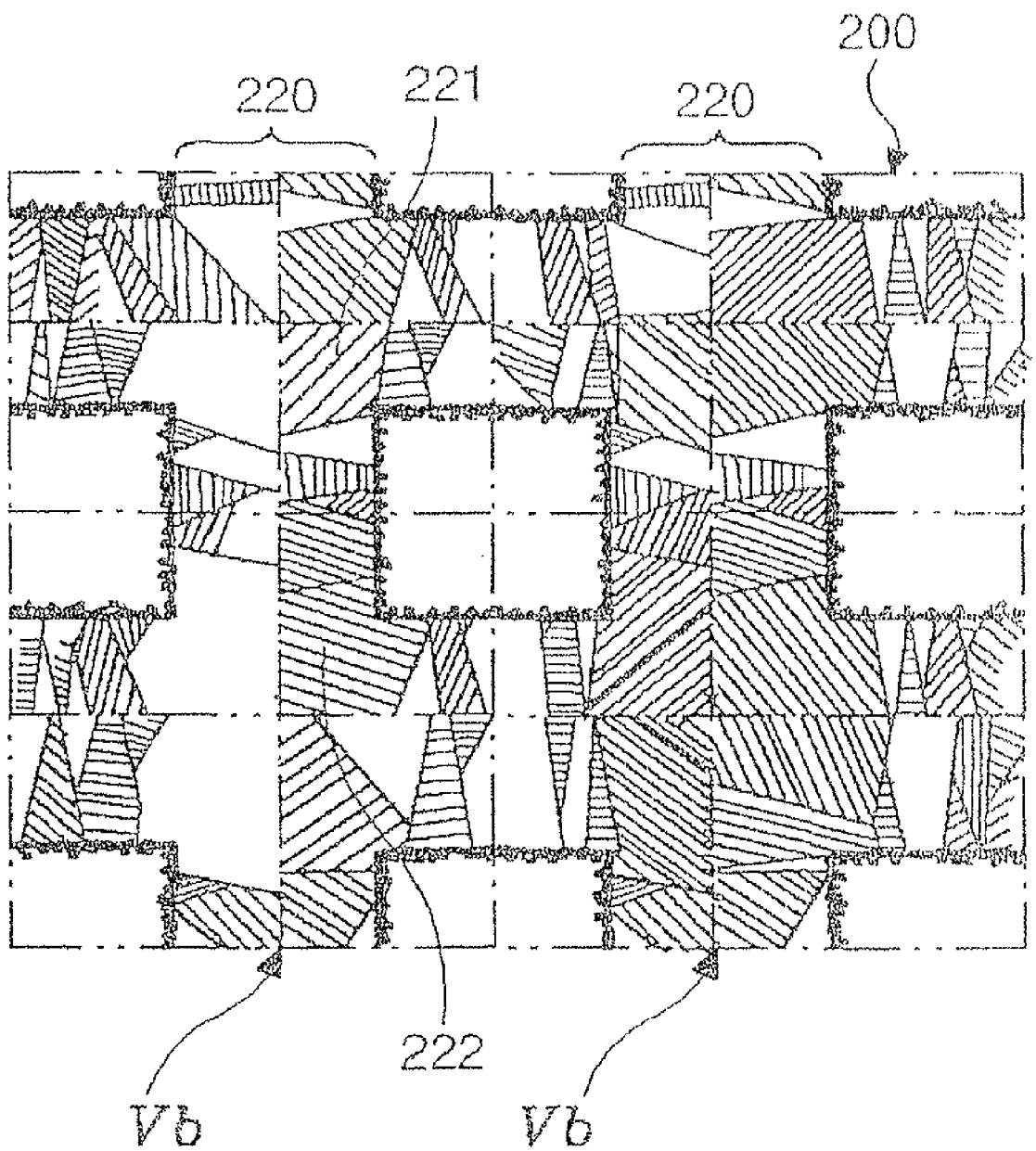

In FIG. 7B, after the silicon film 200 having the first portions 210 crystallized by the first irradiation is moved by a quarter width of the mask 100 (of FIG. 6) to the left, a second irradiation of the laser beam is performed onto second portions 220 of the silicon film 200. As a result, the second portions 220 correspond to the multiple second slits 122 (of FIG. 6) in the second region 120 (of FIG. 6) of the mask 100. The second portions 220 melt and then cool, resulting in crystallization of the silicon film 200. In the second portions 220, second grains 221 and 222 grow from edges of the second portions 220 in a direction perpendicular to a first grain-growth direction of the first grains 211 and 212 (of FIG. 7A). The second grains 211 and 212 stop growing at a line "Vb" where the second grains 211 and 212 meet. In regions where the first and second portions 210 and 220 overlap, the first grains 211 and 212 by the first irradiation act as crystallization seeds. Thus, the second grains 221 and 222 are larger than the first grains 211 and 212.

Figure 7C:
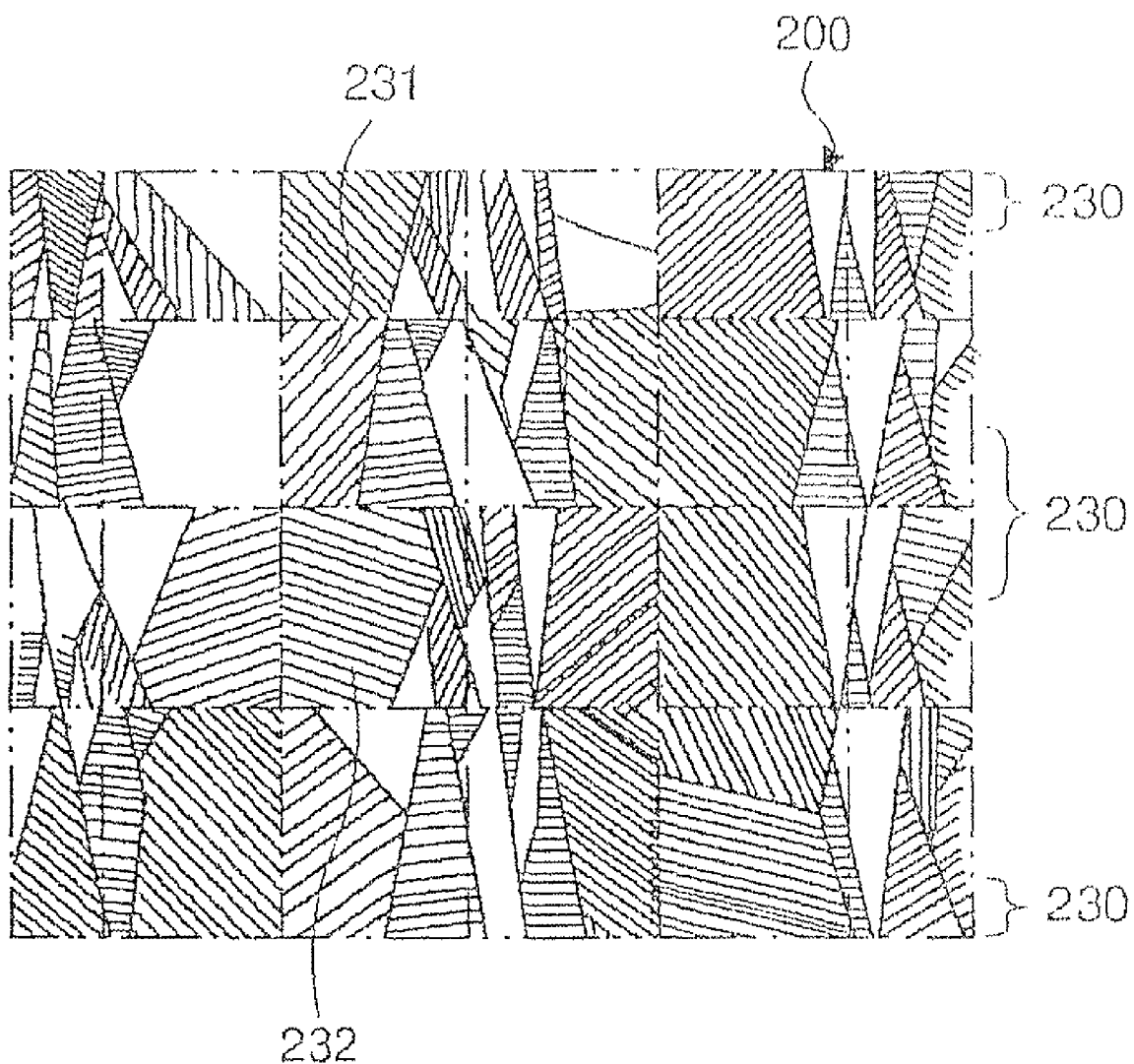

In FIG. 7C, after the silicon film 200 having the first and second portions 210 and 220 (of FIGS. 7A and 7B) crystallized by the first and second irradiations is moved a quarter width of the mask 100 (of FIG. 6) to the left, a third irradiation of the laser beam is performed onto third portions 230 of the silicon film 200. The third portions 230 correspond to the multiple third slits 132 (of FIG. 6) in the third region 130 (of FIG. 6) of the mask 100. The third portions 230 melt and then cool such that crystallization occurs in the third portions 230. In the regions where the second portions 220 and the third portions 230 overlap, the second grains 221 and 222 by the second irradiation act as crystallization seeds. Thus, third grains 231 and 232 by the third irradiation are enlarged.

Figure 7D:
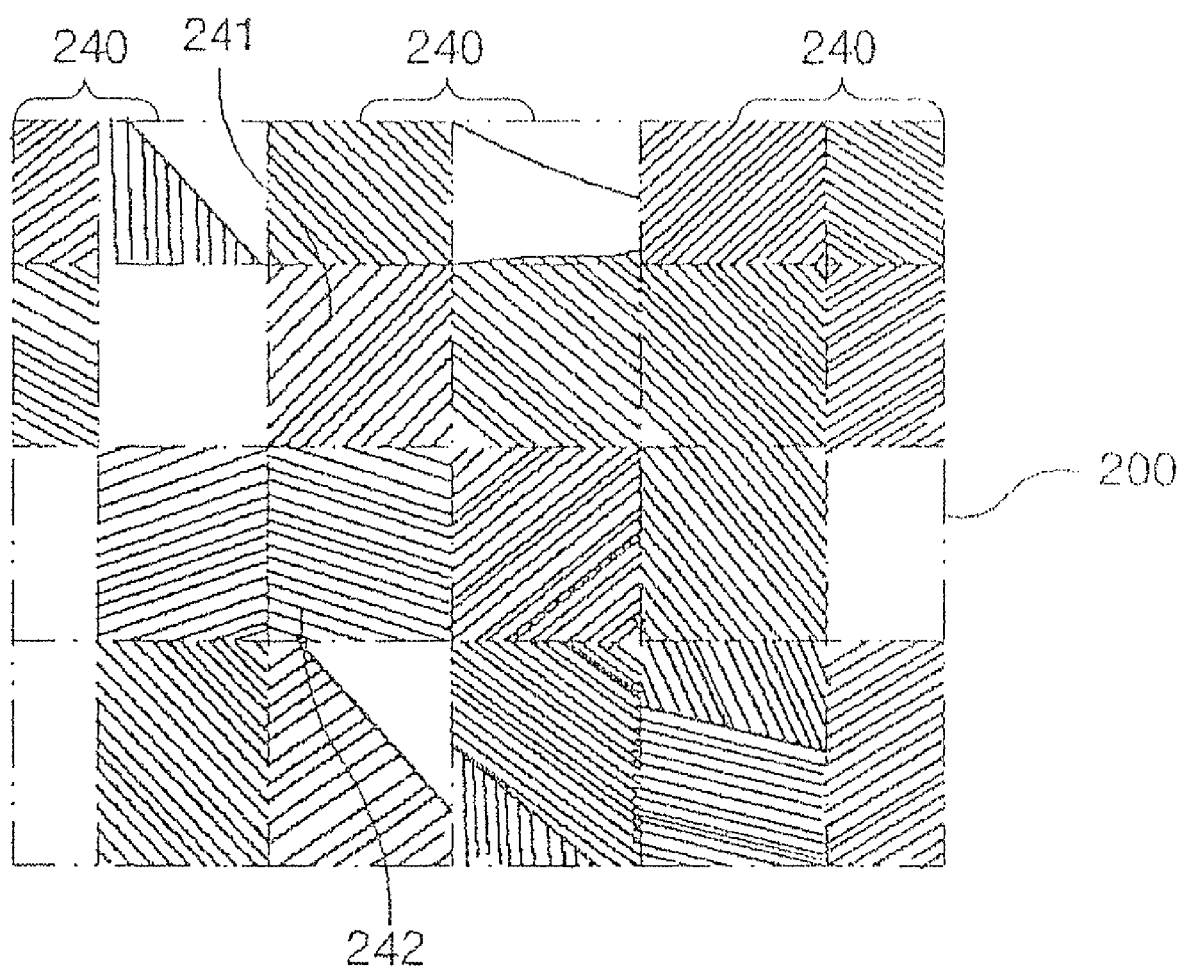

In FIG. 7D, after the silicon film 200 having the first to third portions 210, 220 and 230 (of FIGS. 7A to 70) crystallized by the first to third irradiations is moved by a quarter width of the mask 100 (of FIG. 6) to the left, a fourth irradiation of the laser beam is performed on fourth portions 240 of the silicon film 200. The fourth portions 240 correspond to the multiple fourth slits 142 (of FIG. 6) in the fourth region 140 (of FIG. 6) of the mask 100. The fourth portions 240 melt and then cool such that crystallization occurs. In regions where the third and fourth portions 230 and 240 overlap, the third grains 231 and 232 by the third irradiation act as crystallization seeds. Therefore, fourth grains 241 and 242 having a square shape are obtained.

By repeating the foregoing process, a polycrystalline silicon film having large and relatively uniform grains is created. However, since the polycrystalline silicon film also has a grain boundary (sides of the square shape), a TFT fabricated by using the polycrystalline silicon film has relatively inferior characteristics when a channel of the TFT includes the grain boundary. Accordingly, when the TFT is fabricated such that the channel does not include the grain boundary, improved characteristics of the TFT can be obtained.

Figure 8:
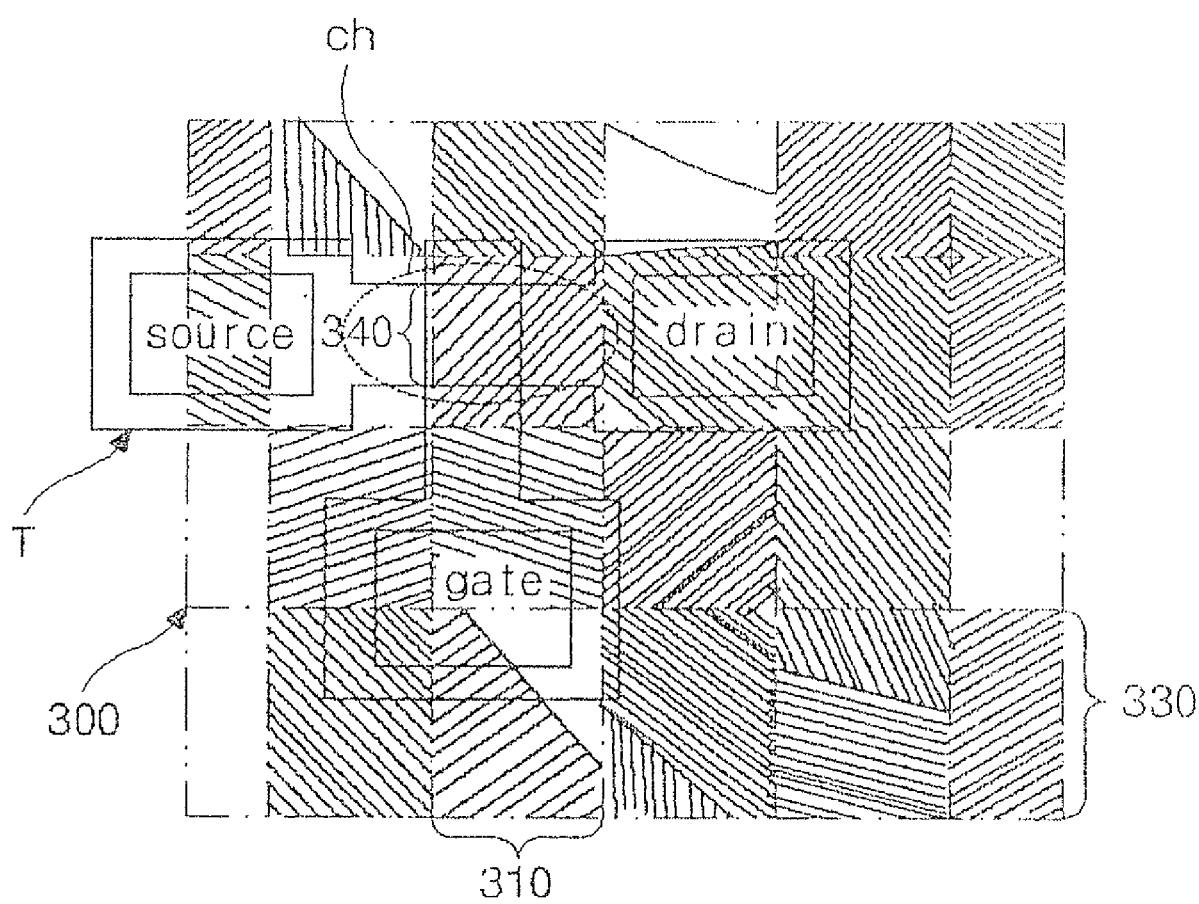
FIG. 8 shows a schematic view depicting a position of a thin film transistor according to a first embodiment of the invention.
Figure 9:
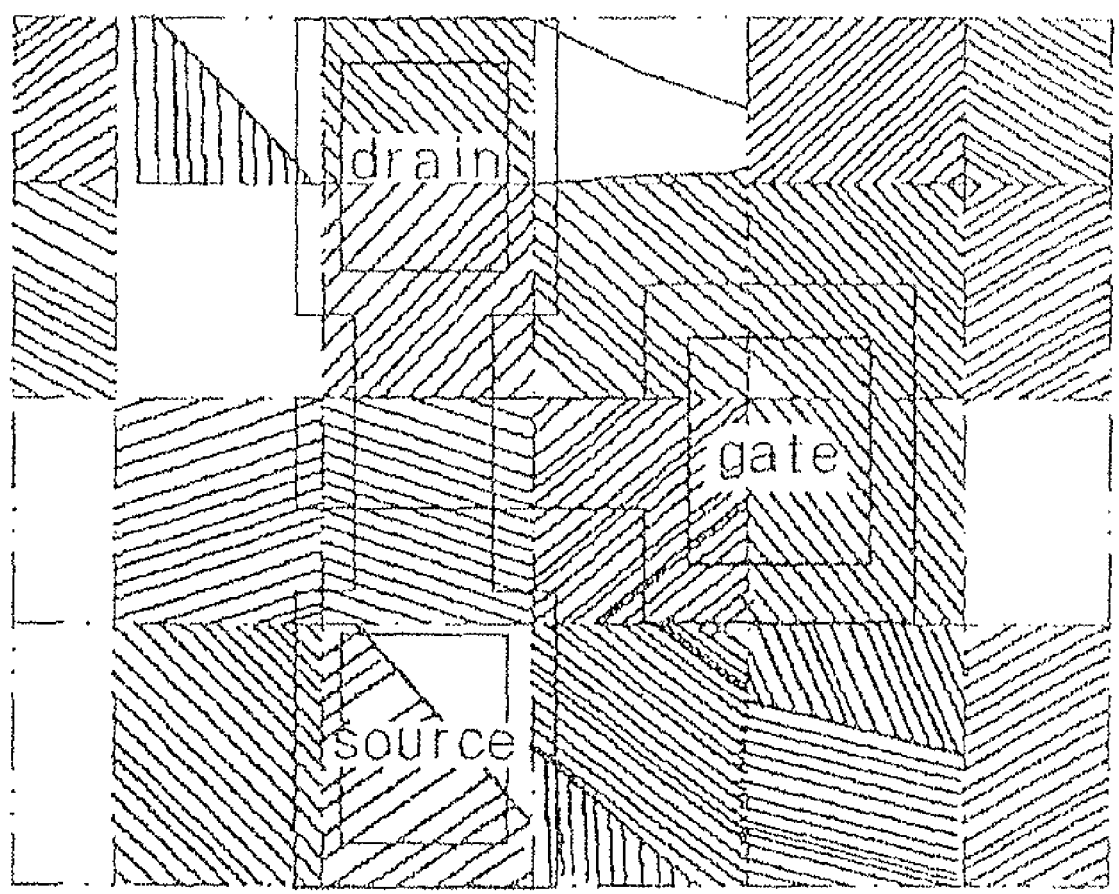
FIG. 9 shows a schematic view of a position of a thin film transistor according to a second embodiment of the invention.

FIGS. 8 and 9 show schematic views of a position of a thin film transistor according to first and second embodiments of the invention, respectively.

FIGS. 8 and 9 show a thin film transistor (TFT) "T" that is formed on a substrate 300 by using the polycrystalline silicon film of FIG. 7D as an active layer. The polycrystalline silicon film has grains of square shape, i.e., grain boundaries are disposed only at sides of the square shape, and the inner portion of the square shape is single crystalline silicon. Accordingly, if the TFT "T" forms having a channel "ch" smaller than the grain, the channel "ch" can be disposed inside of the grain. As a result, when the channel "ch" forms having the width and length 340 and 320 smaller than the two sides 310 and 330 of the grain, the TFT "T" can have a channel "ch" where no grain boundary exits.

TFTs of FIGS. 8 and 9 are disposed along different directions perpendicular to each other. As a result, the channels of the TFTs form in the respective polycrystalline silicon films having different lattice directions. However, since the channels of the TFTs form in one grain, the channels have no grain boundary. Therefore, the TFTs of FIGS. 8 and 9 do not have differences in characteristics due to the disposition direction of the channels.

Figure 10:
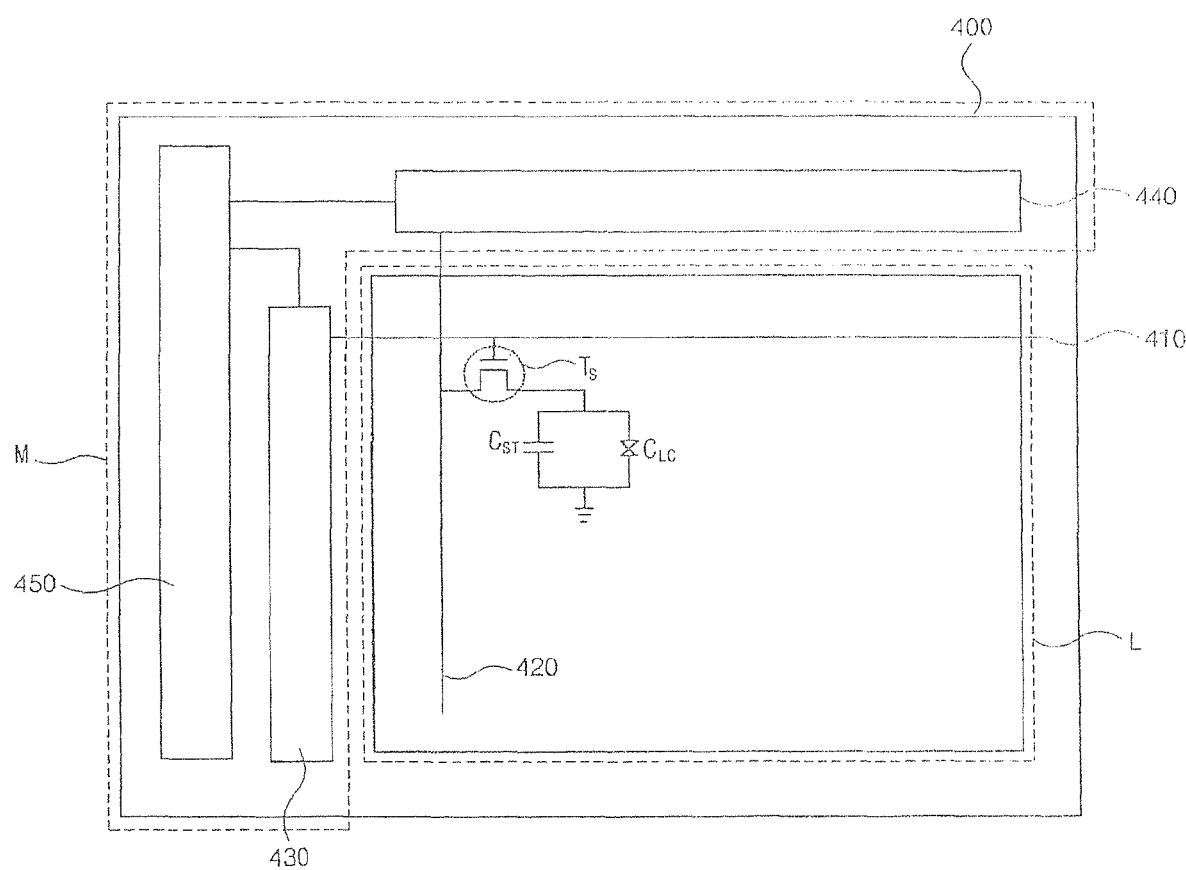
FIG. 10 shows a schematic plane view of an array substrate for a liquid crystal display device according to an embodiment of the invention.

FIG. 10 shows a schematic plane view of an array substrate for a liquid crystal display device according to an embodiment of the invention.

In FIG. 10, an array substrate 400 for an LCD device includes a display region "L" and a peripheral region "M" surrounding the display region "L." Gate and data lines 410 and 420 and a switching TFT "T subs" using polycrystalline silicon are formed in the display region "L." A drive circuit 450 and gate and data drivers 430 and 440 are formed in the peripheral region "M." The switching TFT "T.sub.s" connects to the gate and data lines 410 and 420. The drive circuit 450 includes multiple driving TFTs (not shown) using polycrystalline silicon. Each of the switching TFT "T.sub.s" and the driving TFTs includes an active layer, a gate electrode and source and drain electrodes. The active layer is made of polycrystalline silicon having grains of square shape. The switching TFT "T.sub.s" and the driving TFTs are disposed such that all channels of the TFTs are formed inside the grains. Therefore, the switching TFT and the driving TFTs using polycrystalline silicon have similar characteristics to a transistor using single crystalline silicon.

To form the channel of the TFT inside the grain, one desires that the grain be enlarged or the size of the channel be reduced. Moreover, an alignment key (not shown) for the forming process of the active layer, which is formed during the crystallization process, aligns the channel of the TFT inside the grain. In addition, the TFTs of the drive circuit 450 are arranged according to the position of the grain when the drive circuit and the photo mask are designed.

Consequently, the drive circuit including CMOS devices simultaneously forms on the array substrate to simplify the fabrication process and reduce production costs. Furthermore, since the channel of the TFT is formed inside the grain, the channel has no grain boundary, and the TFT has no resulting property variation in accordance with the direction of disposition. Moreover, since the grain is nearly a single crystal, the property of the TFT is similar to that of a transistor using single crystalline silicon, such as produced from a wafer. Therefore, a gate driver and a data driver are simultaneously formed on a substrate with a pixel TFT. Various drive circuits such as a complex CPU (central process unit) can be integrated in one body according to developments of exposure technology.

It will be apparent to those skilled in the art that various modifications and variations can be made in the liquid crystal display device and the fabricating method thereof of the invention without departing from the spirit or scope of the inventions. Thus, it is intended that the invention covers the modifications and variations of this invention provided they come within the scope of the appended claims and their equivalents.

What is claimed is:

1. A thin film transistor for a liquid crystal display device, comprising:
a substrate;
an active layer over the substrate, the active layer including polycrystalline silicon having square shaped grains;
a gate electrode overlapping the active layer to form a channel region, the channel region being formed inside one of the grains; and
source and drain electrodes connected to both sides of the active layer,
wherein one end of the gate electrode is disposed inside the one of the grains, and the other end of the gate electrode has a size greater than the one of the grains to occupy at least two grains.

2. The thin film transistor according to claim 1, wherein the polycrystalline silicon is obtained by crystallizing amorphous silicon with a laser beam.

3. A thin film transistor, comprising:
a substrate;
an active layer over the substrate, the active layer including polycrystalline silicon grains;
a gate electrode overlapping the active layer to form a channel region, the channel region being formed inside one of the grains; and
source and drain electrodes connected to both sides of the active layer,
wherein one end of the gate electrode is disposed inside the one of the grains, and the other end of the gate electrode has a size greater than the one of the grains to occupy at least two grains.

4. The thin film transistor according to claim 3, wherein the grains are square.

* * * * *